United States Patent
Park et al.

(10) Patent No.: US 6,776,598 B2
(45) Date of Patent: Aug. 17, 2004

(54) SEMICONDUCTOR CHIP MOLDING APPARATUS AND METHOD OF DETECTING WHEN A LEAD FRAME HAS BEEN IMPROPERLY POSITIONED IN THE SAME

(75) Inventors: Kyung-Soo Park, Cheonan (KR); Sung-Soo Lee, Cheonan (KR); Hee-Mo Koo, Asan (KR)

(73) Assignee: Samsung Electronics Co., Ltd., Suwon-si (KR)

(*) Notice: Subject to any disclaimer, the term of this patent is extended or adjusted under 35 U.S.C. 154(b) by 125 days.

(21) Appl. No.: 10/125,402

(22) Filed: Apr. 19, 2002

(65) Prior Publication Data
US 2003/0030187 A1 Feb. 13, 2003

(30) Foreign Application Priority Data
Aug. 7, 2001 (KR) ......................................... 2001-47564

(51) Int. Cl.$^7$ ........................... B29C 45/14; B29C 70/72
(52) U.S. Cl. ........................ 425/116; 425/136; 425/169; 425/174.6
(58) Field of Search ................................ 425/116, 121, 425/125, 136, 169, 174.6; 264/406, 408, 449

(56) References Cited

U.S. PATENT DOCUMENTS

| | | | | |
|---|---|---|---|---|
| 4,574,474 A | * | 3/1986 | Langham | 425/125 |
| 5,123,823 A | * | 6/1992 | Banjo et al. | 425/116 |
| 5,328,347 A | * | 7/1994 | Ten Vaarwerk | 425/116 |
| 5,876,766 A | * | 3/1999 | Chou | 425/136 |

* cited by examiner

Primary Examiner—Robert B. Davis
(74) Attorney, Agent, or Firm—Volentine Francos, PLLC

(57) ABSTRACT

A semiconductor chip molding apparatus includes an upper platen including an upper mold, a lower platen including a lower mold having a molding block configured to receive a lead frame, a controller, and an electrical detector for forming an electrical circuit between the controller and the lead frame when the lead frame is oriented improperly on the lower mold. A low-level test voltage is imparted to at least the lower mold. As a result, an electrical signal will flow from the detecting block when the lead frame rests on the detecting block. When such a signal is detected, therefore, the lead frame is determined as having been improperly set on the molding block. The signal generated is detected by a controller and used thereby to interrupt the operation of the molding apparatus.

6 Claims, 4 Drawing Sheets

SEMICONDUCTOR CHIP MOLDING APPARATUS AND METHOD OF DETECTING WHEN A LEAD FRAME HAS BEEN IMPROPERLY POSITIONED IN THE SAME

BACKGROUND OF THE INVENTION

1. Field of the Invention

The present invention relates to inset-molding. More specifically, the present invention relates to a semiconductor chip molding apparatus and to a method of detecting whether a lead frame is positioned properly in the same.

2. Description of Related Art

The manufacturing of semiconductor devices, known as chip packages, includes an assembly method in which chips are packaged once they have undergone an electrical die sorting (EDS) process in which individual chips having certain electrical and physical characteristics are sorted. Hence, only non-defective chips are packaged.

The assembly method includes a die bonding process of attaching the non-defective chip on a pad of a lead frame, a wire bonding process of electrically connecting bonding pads of the chip to inner lead tip of the lead frame via connector wires, a molding process of encapsulating the chip using an epoxy molding compound so as to protect the chip, the connector wires, the inner leads, and so on, and a forming process of finalizing the form of the chip package so that the chip package may be mounted on a printed circuit board (PCB).

The molding process is performed by a semiconductor molding apparatus. In this apparatus, an epoxy molding compound is heated and pressurized to assume a molten state. The molten compound is then injected into molding cavities to encapsulate semiconductor chips on lead frames set in position in the cavities.

The conventional semiconductor chip molding apparatus also has a sensing unit that determines whether the lead frames are properly positioned in the apparatus before the semiconductor chips are encapsulated with the epoxy molding compound. Thus, the sensing unit attempts to ensure that the molding process is performed properly.

FIG. 1 is a cross-sectional view of the conventional semiconductor chip molding apparatus.

Referring to FIG. 1, the conventional semiconductor chip molding apparatus 90 includes a lower platen 70, and an upper platen 80 opposed to the lower platen 70. A lower mold 50 is integrated with the lower platen 70, and an upper mold 60 is integrated with the upper platen 80.

The lower mold 50 includes a plurality of locater pins 53 at the periphery thereof. The locater pins 53 guide a lead frame 20 into position on the lower mold 50. A port block 55 is disposed at a central portion of the lower mold 50. The molding resin, such as an epoxy molding compound, is supplied through the port block 55 after the lead frame 20 has been set on the lower mold 50.

As mentioned above, the conventional semiconductor chip molding apparatus 90 further includes a sensing unit to determine whether the lead frame has been properly set on the lower mold 50. The sensing unit includes a sensing plate 57 and an approaching sensor 65. The sensing plate 57 and the approaching sensor 65 are disposed on corresponding portions of the lower platen 70 and the upper platen 80, respectively.

After the lead frame 20 is set on the lower mold 50, the upper platen 80 moves down until it contacts the port block 55 on the lower platen 70. During this time, the approaching sensor 65 senses the sensing plate 57 and calculates the distance C between the approaching sensor 65 and the sensing plate 57 to determine whether the lead frame 20 is properly set on the lower mold 50. When the calculated distance C between the lower mold 50 and the upper mold 70 is equal to the thickness d of the port block 55, the lead frame 20 is regarded as being properly set on the lower mold 50. On the other hand, when the distance C between the lower mold 50 and the upper mold 70 is greater than the thickness d of the port block 55, the lead frame 20 is regarded as being improperly set on the lower mold 50.

However, the conventional semiconductor chip molding apparatus has the following disadvantages.

First, the lead frame 20 can be detected as being improperly set on the lower mold 50 only when the lead frame 20 is disposed on the port block 55 as shown in portion B of FIG. 1. In other words, it is impossible to determine when the lead frame 20 has been set on the locater pins 53 as shown in portion A of FIG. 1. This is because the locater pins 53 penetrate the lead frame 20 under the pressure of the upper mold 60. As a result, the locater pins 53 seem as though they are properly inserted into side rail holes (850 in FIG. 3) of the lead frame 20. Therefore, even though the lead frame 20 is improperly set on the lower mold 50, the lead frame 20 is regarded by the sensing unit as being properly set on the lower mold 50.

In addition, even when the lead frame 20 has been placed over the port block 55 as shown in portion B of FIG. 1, the sensing unit can hardly detect the improper positioning of the lead frame 20 because the lead frame 20 is very thin, e.g., is only 5 mil to 10 mil thick.

Moreover, epoxy molding compound scrap, produced in the previous molding process, remains on the lower mold 50. The epoxy molding compound scrap affects the ability of the sensing unit to detect whether the lead frame 20 is properly set on the lower mold 20.

In the conventional semiconductor chip molding apparatus, the lead frame 20 is regarded as being improperly set on the lower mold 50 when the epoxy molding compound scrap has a thickness of more than 0.3 mm. However, the conventional semiconductor chip molding apparatus is calibrated to detect epoxy molding compound scrap having a thickness of more than 0.5 mm for the purpose of preventing the epoxy molding compound scrap from producing an abnormal operation. Thus, the ability of the apparatus to determine whether the lead frame is properly set on the lower mold is nominal. Consequently, the manufacturing yield is poor.

SUMMARY OF THE INVENTION

An object of the present invention is to overcome the above described problems and limitations of the prior art. More specifically, it is one object of the present invention to provide a semiconductor chip molding apparatus that can accurately and surely detect whether a lead frame is properly set in position. It is another object of the present invention to provide an inset-molding apparatus having an improved manufacturing yield.

In order to achieve the above object, the molding apparatus comprises an upper platen including an upper mold, a lower platen including a lower mold having a molding block defining at least one mold cavity; a controller that controls an operation of the semiconductor chip molding apparatus; and an electrical detector for forming an electrical circuit between the controller and the lead frame or other metal part to be inset-molded when the lead frame or metal part is oriented a certain way, i.e., improperly, on the lower mold.

The detector includes at least one detecting block positioned adjacent the molding block so as to contact the lead frame when the lead frame is improperly set on the molding block. The detecting block is electrically insulated from components of the molding apparatus, including the lower mold. A detecting wire connects the detecting block to the controller and transfers the electrical signal to the controller.

The detector further includes a connecting block connected to the detecting block. The connecting block includes a conductive spring or a screw disposed in contact the detecting block so as to transfer an electrical signal from the detecting block to the controller.

Another object of the present invention is to provide a method for use in operating an inset-molding apparatus, in particular, a method of operating a semiconductor chip molding apparatus, which accurately detects when a metal part such as a lead frame to be inset-molded is improperly positioned over the mold cavity.

The method comprises: setting the lead frame or other metal part to be inset-molded on a conductive lower mold of the molding apparatus; providing at least one electrically conductive detecting block adjacent the lower mold, and electrically insulating the at least one electrically conductive block from at least the lower mold; and subsequently imparting a voltage to at least the lower mold.

As a result, an electrical signal will flow from the detecting block when the lead frame or other metal part to be insert-molded rests on the detecting block. When such a signal is detected, therefore, the lead frame or other metal part is determined as having, for example, been improperly set on the molding block. The signal generated is detected by a controller and thereby used to control the further operation of the apparatus. In particular, the controller interrupts the operation of the molding apparatus when the monitoring of the detecting block for an electrical signal indicates that the part to be inset-molded is mis-positioned on the molding block relative to the mold cavity.

BRIEF DESCRIPTION OF THE DRAWINGS

These and other objects, features and advantages of the present invention will become more apparent from the following detailed description of the preferred embodiments thereof made with reference to the accompanying drawings, in which like reference numerals denote like parts, and of which.

DETAILED DESCRIPTION OF PREFFERED EMBODIMENTS

Figure 2:
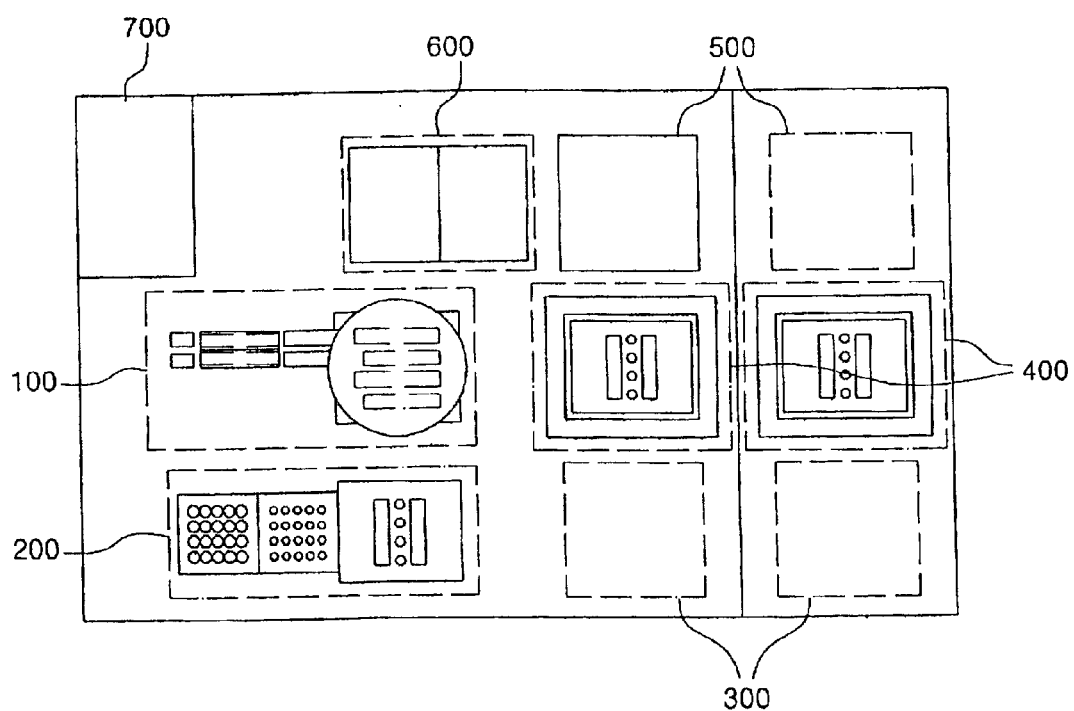
FIG. 2 is a schematic diagram of a semiconductor chip molding apparatus according to the present invention.

Referring now to FIG. 2, the semiconductor chip molding apparatus 900 of the present invention includes a loading portion, a molding portion, an unloading portion, and a controller 700.

The loading portion serves to load a lead frame onto the molding portion, and includes a lead frame supplying unit 100 for supplying a lead frame 800 (see FIG. 3), a tablet unit 200 for supplying a molding resin, such as an epoxy molding compound, in mass, and a loader unit 300 for transferring the lead frame 800 from the lead frame supplying unit 100 and the molding resin from the tablet unit 200 to the molding portion, respectively.

The molding portion includes a molding unit 400 for encapsulating the lead frame 800 in package form using the molding resin, and a driving unit (not shown) for driving the molding unit 400 meaning that it appropriately pressurizes and heats the molding resin in the molding unit 400.

The unloading portion includes an unloading unit 500 for unloading the packaged lead frame 800 from the molding unit 400, and a stacking unit 600 for sequentially stacking the packaged lead frames 800 unloaded by the unloading unit 500.

Figure 1:
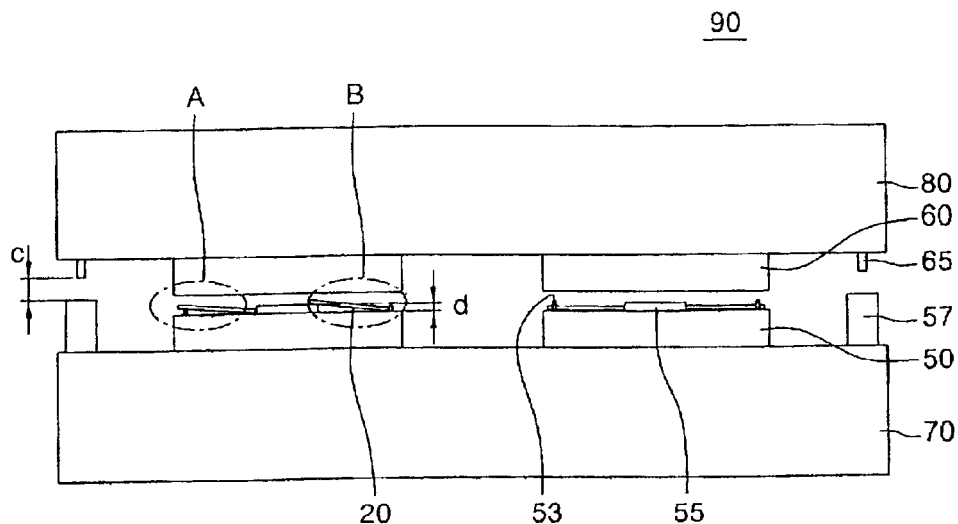
FIG. 1 is a cross-sectional view of a conventional semiconductor chip molding apparatus.
Figure 6:
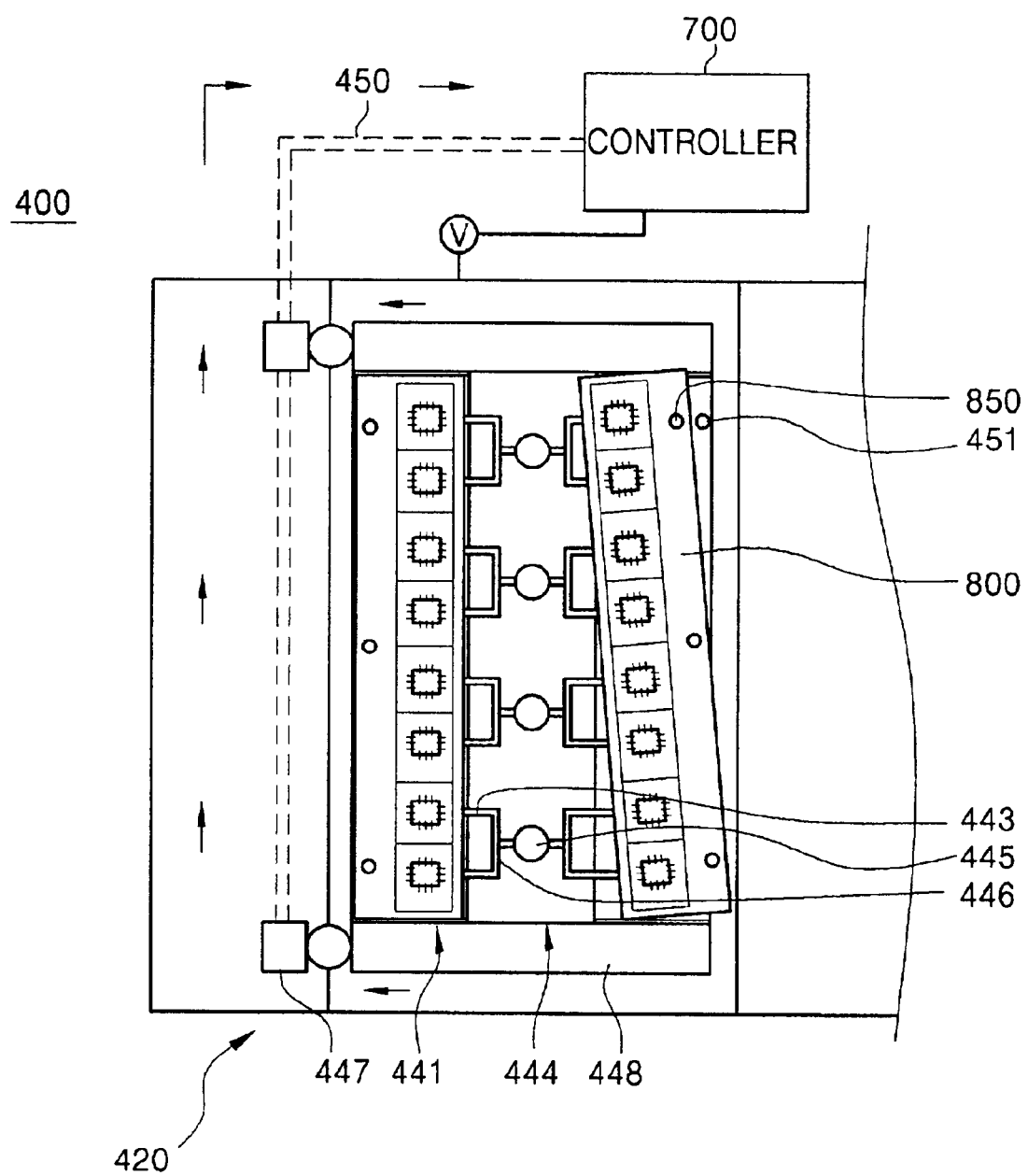
FIG. 6 is a similar view showing a state in which the lead frame is oriented improperly on the molding block.

The controller 700 controls all of the operating equipment of the semiconductor chip molding apparatus of FIG. 1, and stops the operation of the semiconductor chip molding apparatus 900 when the lead frame 800 is improperly set on the molding unit 400 as shown in FIG. 6.

Figure 3:
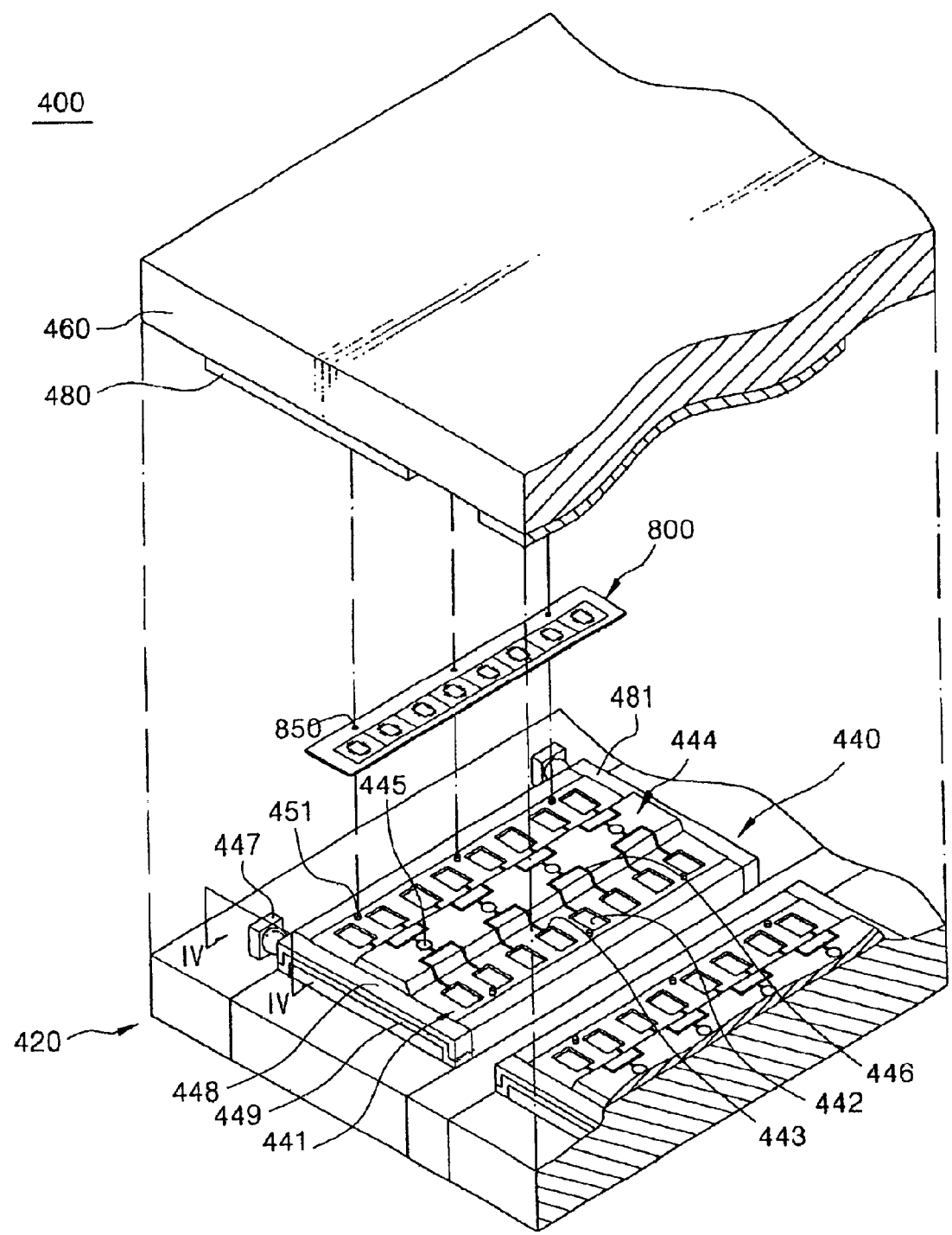
FIG. 3 is a perspective view of a molding unit according to the present invention.

Referring now to FIG. 3, the molding unit 400 includes a lower platen 420 and an upper platen 460. A lower mold 440 is secured to the lower platen 420, and an upper mold 480 opposed to the lower mold 440 is secured to the upper platen 460.

The lower mold 440 is made of a conductive material, and includes a port block 444 for substantially supplying the molding resin in mass, and a molding block 441 on which the lead frame 800 is set. The molding block 441 is located at both sides of the lower mold 440, whereas the port block 444 runs along the central part of the lower mold 440. The port block 444 includes a ram port 445 on which the molding resin is placed, and a runner 446 along which molten molding resin flows into a mold cavity 442. The molding block 441 includes a plurality of the mold cavities 442 that accommodate a plurality of semiconductor chips mounted on the lead frame 800.

Each of the cavities 442 has a shape corresponding to that of the final package and includes a gate 443 that communicates with a runner 446. The gate 443 serves as an inlet through which the molten molding resin flows into the cavity 442.

Figure 5:
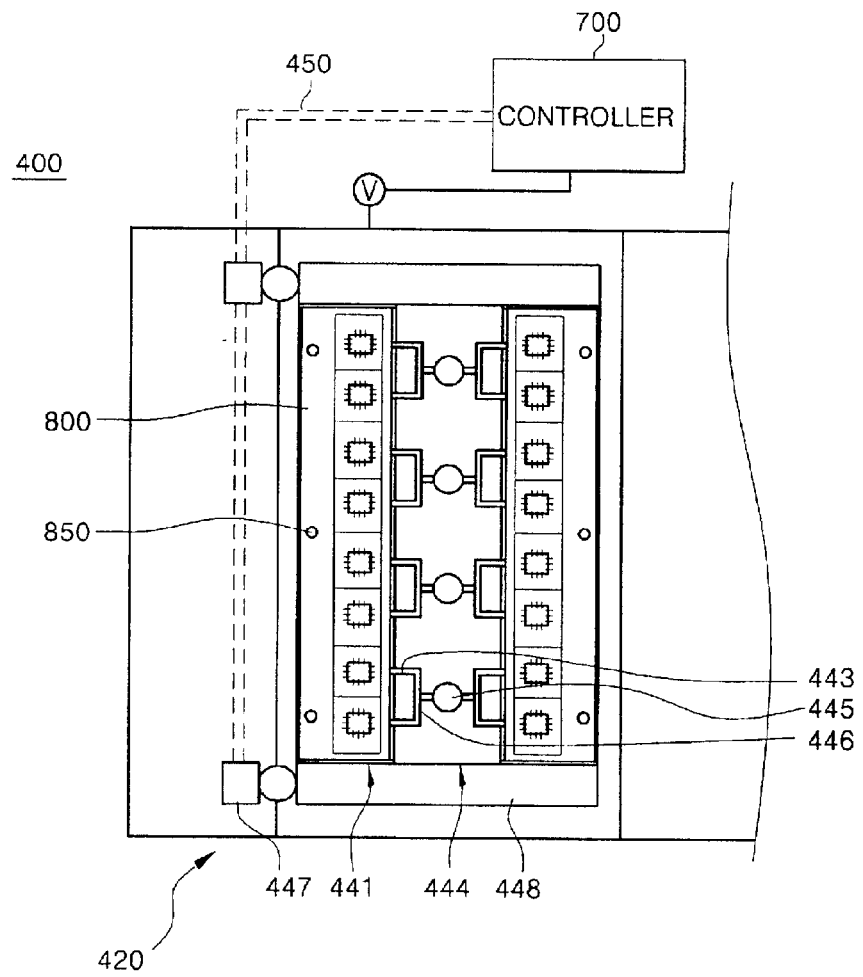
FIG. 5 is a plan view of a portion of the molding unit showing a state in which a lead frame is oriented properly on the molding block.

The molding block 441 also includes a plurality of locater pins 451 spaced along an outer edge thereof. The locater pins 451 are disposed at locations corresponding to side rail holes 850 of the lead frame 800. When the lead frame 800 is property set on the molding block 441 as shown in FIG. 5, the locater pins 451 are received in the corresponding side rail holes 850 of the lead frame 800.

The molding unit 400 also comprises lead frame detecting means operable to generate a signal that stops the operation of the semiconductor chip molding apparatus 900 when the lead frame 800 is improperly set on the molding block 441. The lead frame detecting means includes a detecting block 448 that effectively senses a state of orientation of the lead frame 800, and a connection block 447 and a detecting wire 450 (see FIG. 5) which transfer an electrical signal from the detecting block 448 to the controller 700.

Figure 4:
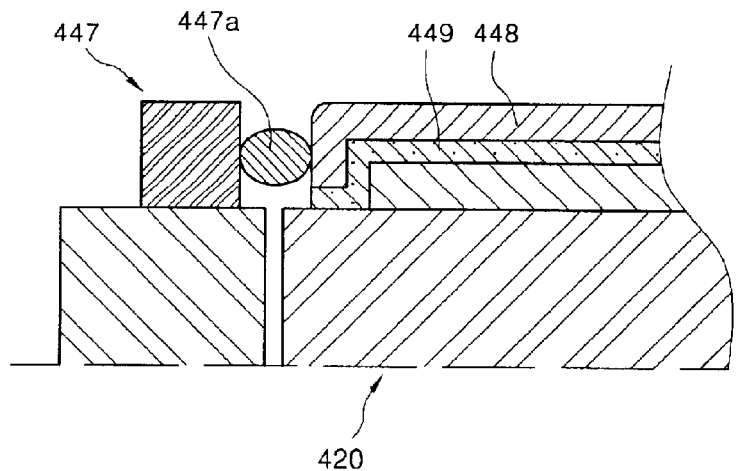
FIG. 4 is a cross-sectional view taken along line IV—IV of FIG. 3.

The detecting block 448 is made of a conductive material. Preferably, two detecting blocks 448 are oriented perpendicular to the longitudinal direction of the lower mold 440, i.e., perpendicular to the lead frame 800, at opposite ends of the lower mold 440. The detecting block 448 is electrically insulated from the other components of the bottom half of the molding apparatus 400, such as the lower platen 420, the molding block 441, and the port block 444. Preferably, an insulating member 449, comprising any suitable electrical insulator, isolates the detecting block 448 (see FIG. 4). In this case, the insulating member 449 comprises a lining of electrically insulating material interposed between the port block 444 and the detecting block 448, between the molding block 441 and the detecting block 448, and between the lower platen 420 and the detecting block 448. The insulating member 449 can be formed unitarily with or separately from the detecting block 448.

The connecting block 447 is also made of a conductive material and is electrically isolated from the lower mold 440 and any component electrically conductively connected thereto. Preferably, two such connecting blocks 447 are electrically connected to the corresponding detecting blocks 448 via a conductive connecting member 447a such as a metal spring or a screw. The connecting member 447a serves as an electrical contact that presses against the connecting block 447 when the lower mold 440 is attached to the lower platen 420. The detecting wire 450 shown in FIG. 5 is electrically connected to each detecting block 448 via only a connecting block 447, and is electrically connected to the controller 700.

Hereinafter, the operation of the semiconductor chip molding apparatus 900 and a method of detecting whether the lead frame has been improperly set in position on the lower mold 440 will be described with reference to FIGS. 2 to 6.

The lead frame 800 having semiconductor chips thereon is stacked on the lead frame supplying unit 100. The loading unit 300 transfers the lead frame 800 from the lead frame supplying unit 100 to the molding block 441 of the molding unit 400. The loading unit 300 sets the lead frame 800 on the molding block 441 such the side rail holes 850 of the lead frame 800 receive the locater pins 451. At the same time, the loading unit 300 also transfers molding resin to the ram port 445 of the port block 444. The port block has been previously heated such that at this moment, the port block 444 has a temperature of about 180° C. Thus, the molding resin becomes molten when it is placed on the ram port 445.

When the lead frame 800 is properly set on the molding block 441, the driving unit (not shown) exerts a predetermined driving force on the lower platen 420 or the upper platen 460 of, for example, about 3 tons. As a result, the lower mold 440 and the upper mold 480 are forced together under a pressure of about 120 torr.

At this moment, the driving unit pushes the molten mold resin out of the ram port 445 using a mechanical element, e.g., a piston. The molten molding resin flows via the runner 446 into the cavity 442 or, more specifically into the cavity formed by the confronting molding blocks of the lower mold 440 and the upper mold 480.

The molten molding resin remains in the cavity 442 for a predetermined time period until it is cured. Once the molding resin is cured, the semiconductor chip is encapsulated. Subsequently, the unloading unit 500 unloads the packaged lead frame 800 from the molding unit 400 and transfers it to the stacking unit 600, whereupon the molding process is complete.

Now, if the lead frame 800 transferred from the lead frame supplying unit 100 by the loading unit 100 is set somewhat askew on the molding block 441, i.e., improperly, the lead frame 800 rests atop the locater pins 451 and the port block 444. In this case, the lead frame 800 also contacts one or more of the detecting blocks 448. Therefore, the detecting block(s) 448 is/are electrically connected to the lower mold 440 because the lead frame 800 is an electrical conductor. That is, the lead frame 800 serves as a switch for electrically connecting the lower mold 440 to the detecting block 448.

A voltage is applied by a voltage source V across some point on the semiconductor chip molding apparatus 900, except at the detecting block 448. This test voltage is a low voltage for the sake of safety. In particular, a voltage of about −24 volts is applied to any one of several components of the semiconductor chip molding apparatus 900 that include or are otherwise in an electrical conductive relationship with the lower mold 440. Therefore, a signal having a voltage of −24 volts will flow into the controller 700 through the detecting block 448 and the detecting wire 450 via locater pins 451 and/or port block 444, and lead frame 800. Consequently, the controller 700 recognizes that the lead frame 800 is improperly set on the molding block 441. The controller 700 thus stops the operation of the semiconductor chip molding apparatus 900.

As is clear form the description above, the semiconductor chip molding apparatus according to the present invention can accurately detect whether the lead frame is properly set on the molding block, whereby the manufacturing yield can be improved.

Although the present invention has been particularly shown and described with reference to the preferred embodiments thereof, the form and details thereof may be changed in various ways, as will be apparent by those of ordinary skill in the art, without departing from the true spirit and scope of the invention as defined by the appended claims.

What is claimed is:

1. A semiconductor chip molding apparatus, comprising:

an upper platen and an upper mold fixed to the upper platen;

a lower platen and a lower mold of electrically conductive material fixed to the lower platen, the lower mold including a molding block configured to receive a lead frame in an orientation proper for a molding process to be performed on the lead frame by the apparatus, the molding block defining at least one mold cavity;

at least one electrically conductive detecting block disposed adjacent said lower mold such that when a lead frame is set on the lower mold askew from said proper orientation, a portion of the lead frame will contact said at least one detecting block while in contact with said lower mold, said at least one electrically conductive block being electrically insulated from all electrically conductive components of the molding apparatus that are electrically conductively connected to said lower mold; and a controller to which said at least one electrically conductive detecting block is connected, whereby when a voltage is imparted to said components while a lead frame positioned on the lower mold contacts the at least one detecting block, an electrical signal will flow to said controller via said at least one detecting block.

2. The apparatus of claim 1, and further comprising a connecting block including a conductive spring or a screw contacting each said at least one detecting block, and a detecting wire connecting the connecting block to said controller.

3. The apparatus of claim 1, wherein said at least one detecting block comprises a pair of detecting blocks disposed at opposite ends of said lower mold, respectivley.

4. The apparatus of claim 2, wherein said at least one detecting block comprises a pair of detecting blocks disposed at opposite ends of said lower mold, respectivley.

5. The apparatus of claim 4, wherein a respective connecting block having a conductive spring or a screw contacts each of the detecting blocks, and said detecting wire runs between the connecting blocks and to said controller.

6. The apparatus of claim 1, wherein electrically insulative material is interposed between each said at least one detecting block and said lower mold.

* * * * *